United States Patent [19]

Thillays

[11] 4,292,735

[45] Oct. 6, 1981

[54] METHOD OF MANUFACTURING A COPLANAR PHOTOCOUPLER

[75] Inventor: Jacques C. Thillays, Herouville St. Clair, France

[73] Assignee: U.S. Philips Corporation, New York, N.Y.

[21] Appl. No.: 49,015

[22] Filed: Jun. 15, 1979

[30] Foreign Application Priority Data

Jun. 16, 1978 [FR] France ................................ 78 18081

[51] Int. Cl.³ .......................... G02B 27/00; G02B 5/14; H01L 31/12
[52] U.S. Cl. ........................................ 29/854; 29/413; 29/527.4; 250/551; 264/1.9; 264/268; 264/297
[58] Field of Search ...................... 29/413, 414, 592 R, 29/592 F, 527.4, 854, 527.1; 264/1, 92, 268, 297; 156/245; 350/103, 105, 106; 250/551

[56] References Cited

U.S. PATENT DOCUMENTS

| | | | |
|---|---|---|---|
| 2,150,282 | 3/1939 | Lord et al. ............................ | 264/297 |
| 2,841,863 | 7/1958 | Geisler .................................. | 29/413 |
| 3,082,397 | 3/1963 | Clarkson et al. ..................... | 29/413 |
| 3,164,645 | 1/1965 | Vries et al. ........................... | 264/1 |
| 3,928,106 | 12/1975 | Molnar ................................ | 156/245 |
| 3,963,309 | 6/1976 | Schwab ................................ | 264/1 |
| 3,976,877 | 8/1976 | Thillays ............................... | 250/551 |
| 4,112,308 | 9/1978 | Olschewski et al. ............... | 250/551 |

FOREIGN PATENT DOCUMENTS 2455888 11/1975 Fed. Rep. of Germany .......... 264/1

Primary Examiner—Carl E. Hall
Attorney, Agent, or Firm—Thomas A. Briody; William J. Streeter; Algy Tamoshunas

[57] ABSTRACT

Disclosed is a method of manufacturing coplanar photocouplers comprised of a photo-conductor of transparent plastic material covered with a metal mirrors in which a mosaic of recesses is formed in a sheet of deformable metal by deep drawing and the recesses are then filled with plastic in a liquid form. After curing of the plastic the optical elements thus formed are separated from each other.

7 Claims, 5 Drawing Figures

METHOD OF MANUFACTURING A COPLANAR PHOTOCOUPLER

The invention relates to a method of manufacturing a coplanar photocoupler comprising a light emitter and a photosensitive receiver which are coupled by an optical element comprised of a photo-conductor in the form of a transparent plastic material covered with a metal mirror.

In circuits used in optoelectronics it is known to place the light emitter and photo-receiver on the same surface and to couple them by an optical element which consists of a photo-conductor with a concave mirror the shape of which is elliptical or, if desired, spherical.

The manufacture of such photocouplers has disadvantages, especially due to the price of the optical element, in particular if the photo-conductor is manufactured from glass having a high index of refraction. Furthermore, the shape of known optical elements is usually complicated.

The manufacture of such photocouplers is also difficult to automate. These difficulties are related in particular to problems in positioning the optical element relative to the semiconductor crystals from which the light emitter and the photo receiver are made. On the other hand, the other steps of the manufacture of photocouplers are carried out by suitable apparatus which require only little manual labour. This is the case especially with welding of the semiconductor crystals on the connection lugs and also with the positioning of the crystals carrying the transmitters relative to the crystals carrying the photo-receivers.

The presently known simplest optical elements consist of a photo-conductor which is moulded from glass having a high index of refraction or from a transparent plastic material and is covered with a metal layer deposited by conventional metallization methods.

In the former case the transfer efficiency of the light from the emitter to the receiver remains moderate and furthermore the price of the moulded glass is considered as restricting. In the latter case the price still remains high when the processing of the photoconductor cannot be used in series production.

It is to be noted that the majority of the known methods of manufacturing photo-conductors provide a product the shape accuracy of which is insufficient to ensure a good reproducibility of the performances of one photocoupler relative to another.

It is the object of the present invention to provide a method of manufacturing photocouplers in which the processing of the photo-conductors is carried out according to methods which are suitable for series production. For that purpose, the method according to the invention is characterized in that a mosaic or pattern of recesses is provided in a sheet of deformable metal by deep drawing. Each recess has the shape of the aforementioned mirror and each is then filled with the plastic material in liquid form which cures afterwards. The optical elements formed in this manner are separated from each other after curing and after other operations required to make the photocoupler are carried out.

This method makes the manufacture of optical elements easier and reduces the number of steps because the mould, which determines the shape of the photo-conductor, may afterwards be used as a reflecting mirror. Every optical element thus formed is mechanically bonded to the adjacent elements, which facilitates certain operations. The separation of the optical elements is very simple.

Before the separation of the optical elements has been completed, the mosaic of recesses filled with the plastic material is preferably attached to a flexible adhesive carrier and weakened areas are provided between the recesses, the elements are separated along the weakened areas by forcing them one by one from the adhesive carrier and they are then incorporated in the photocoupler. This may be carried out, for example, by local pressure on one of the surfaces of an element and suction on the other, especially by means of a pipette.

This method of severing and manufacturing is similar to that which is used in semiconductor crystals so that the method according to the invention may use already existing apparatus.

The plastic material preferably is a synthetic epoxy resin of the cycloaliphatic series or of the bisphenol. A series to which has initially been added in known manner a "hardener", especially an anhydride, and, possibly, an "accelerator".

The invention will now be described in greater detail, by way of example, with reference to the accompanying drawings, in which FIGS. 1 to 3 show diagrammatically the optical element in various stages of its manufacture.

Figure 1:
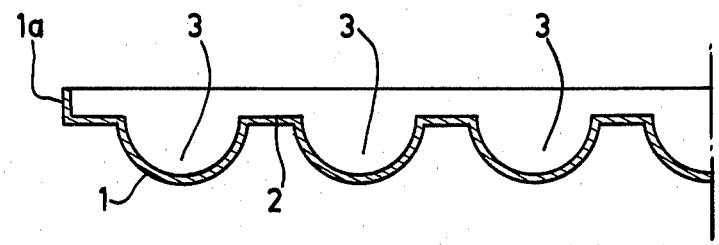

FIG. 1 is a cross-sectional view of a mould 1 in which a number of depressions 3 are provided in lines and columns to form a regular mosaic. The profile of the depressions corresponds to that of the photoconductors to be manufactured. The depressions 3 of the mould are obtained by deep drawing from a sheet of aluminium 2 having a thickness of 6 to 20 hundredths of a millimeter.

Figure 2:
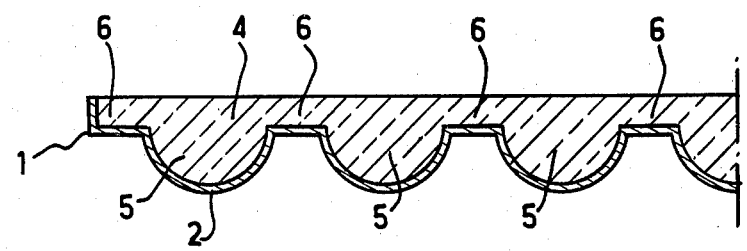

The depressions 3 are filled with a polymerizable transparent resin 4 which is allowed to solidify (FIG. 2). For the following operations it is desirable to have the mould 1 entirely filled. The resin 4 is chosen because it adheres to the metal 2 of the mould 1 in a manner such that after solidification the resin 4 and the sheet 2 of aluminium form one assembly.

The resin 4 is an epoxy of the cycloaliphatic series or of that of the bisphenol A resins to which a hardener and possibly an accelerator has been added. In particular, the resin may, for example, be the material identified in the catalogue of CIBA by the commercial name CY 179 and the anhydride hardener HY 905. Benzyl dimethylamine may, for example, be used as an accelerator.

The assembly formed by the aluminium sheet 2 and the solidifed resin 4 constitutes a mosaic of photoconductors 5 which are interconnected by separation spaces 6. The flat surface 8 of assembly is adhered to a flexible adhering disc 7. The flexible adhering disc 7 preferably is elastic polyethylene coated with a layer of silicone glue.

Figure 3:
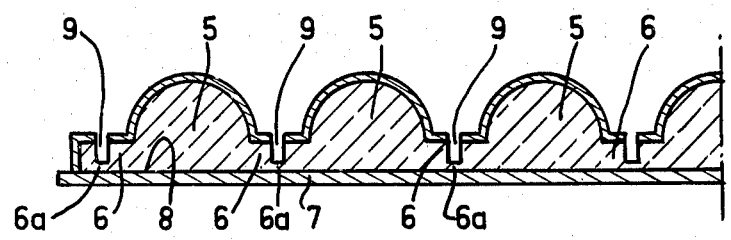

Grooves 9 (FIG. 3) are then provided in the sheet 2 and in the central part of the separation spaces 6. This operation is generally carried out by a saw which is used for severing the semiconductor crystals.

Figure 4:
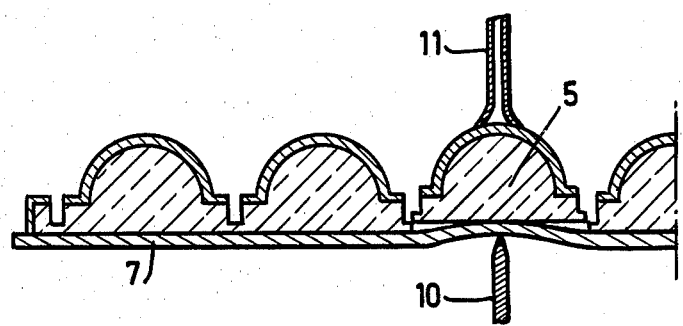
FIG. 4 shows diagrammatically how an optical element is taken from a mosaic of optical elements.
Figure 5:
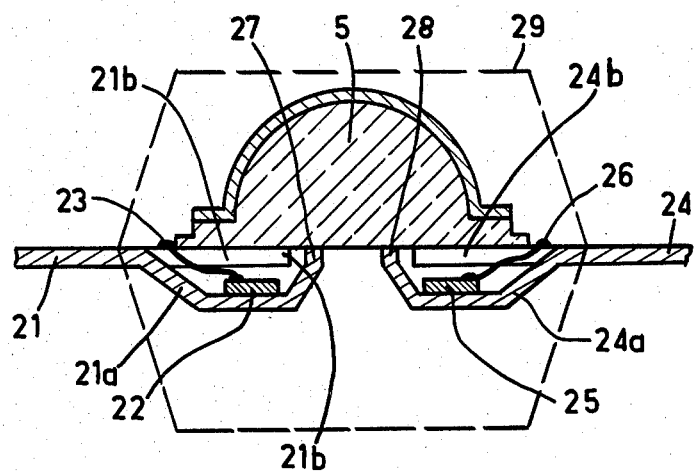
FIG. 5 is a diagrammatic sectional view of a photocoupler having a light emitter and a photo-receiver which are coupled by an optical element obtained by means of the method according to the invention.

The grooves 9 which are divided in lines and columns cross each other and thus limit the optical elements 5 without, however, separating them totally so that connectors 6a of a small thickness remain. From this instant on the mosaic of optical elements may be treated in the manner which is known per se for semiconductor plates carrying transistors or integrated circuits and which is shown in FIG. 4. According to this method, a fine tip 10 is provided on the rear face of the flexible disc 7 so as to lift an element 5 which then detaches from the disc 7. Simultaneously, the element 5 is attracted by the vacuum pick-up 11. The element 5 is then provided on a photosensitive device. FIG. 5 shows the optical element provided in a photocoupler.

A first metal conductor 21 is provided with two connection lugs 21a and 21b of which one, 21a, which is in the form of a cavity, serves as a carrier for the crystal 22 (for example, the light emitter) and also ensures the electric contact with a first region of the crystal, the second region being connected to the lug 21b via the wire 23. A second metal conductor 24 comprises two connection lugs 24a and 24b of which one, 24a, which is in the form of a cavity, serves as a carrier for the crystal 25 (photo-receiver) and constitutes an electric connection with a first region of that crystal. The second region is in electric contact with the lug 24b via the wire 26.

The conductors 21 and 24 are parts of metal combs having a plurality of such parts.

The crystals 22 and 25 are covered by the optical element 5 which, for example, is hemispherical and which bears on the edges 27 and 28 of the lugs 21a and 24a. The optical element 5 is maintained by means of a drop of transparent resin provided on the lugs before the element is provided in its place.

The photocoupler is then embedded in an opaque resin the outer circumference of which is shown in FIG. 5 by the broken line 29.

It will be obvious that the method according to the invention is not restricted to the embodiments of the photocoupler described by way of example, but may on the contrary very favourably be used with any other type of optical element which in particular necessitates an accurate orientation of said element on the photocoupler during the manufacture.

What is claimed is:

1. A method of making a plurality of photocouplers each having a light emitter, a photosensitive receiver and an optical element comprised of a photoconductive plastic covered with a metal mirror for coupling light from said light emitter to said photosensitive receiver, said method comprising the steps of providing a sheet of deformable metal having a pattern of deep drawn recesses formed therein, said recesses each having a shape corresponding to that desired for the mirror, filling said recesses with said plastic in liquid form, curing said plastic so that it solidifies in and adheres to the metal surface of said recesses to thereby form a plurality of said elements wherein the metal surfaces of said recesses define said mirrors, thereafter separating said elements from each other, and attaching one of said light emitters and one of said photosensitive receivers to each of said elements to thereby form a plurality of said photocouplers.

2. The method according to claim 1 including, prior to said separating step, adhering a flexible support to the solidified plastic and providing weakened areas between adjacent ones of said elements, and wherein said step of separating includes the step of forcing said elements one by one from said support.

3. The method according to claims 1 or 2 wherein said plastic is a synthetic epoxy resin containing a hardener.

4. The method according to claim 3 wherein said plastic includes an accelerator.

5. The method according to claim 3 wherein said plastic is a cycloaliphatic epoxy resin.

6. The method according to claim 3 wherein said plastic is a bisphenol A epoxy resin.

7. The method according to claim 1 wherein said sheet is aluminum.

* * * * *